United States Patent [19]

Eichelberger et al.

[11] Patent Number: 4,866,508
[45] Date of Patent: Sep. 12, 1989

[54] INTEGRATED CIRCUIT PACKAGING CONFIGURATION FOR RAPID CUSTOMIZED DESIGN AND UNIQUE TEST CAPABILITY

[75] Inventors: Charles W. Eichelberger; Kenneth B. Welles, II, both of Schenectady; Robert J. Wojnarowski, Ballston Lake, all of N.Y.

[73] Assignee: General Electric Company, Schenectady, N.Y.

[21] Appl. No.: 912,457

[22] Filed: Sep. 26, 1986

[51] Int. Cl.$^4$ .............................................. H01L 23/02
[52] U.S. Cl. ........................................ 357/74; 357/45; 357/55; 357/75; 357/80; 361/400; 361/412; 361/414; 29/832; 174/68.5
[58] Field of Search .................. 357/74, 40, 45, 55; 361/397, 399, 400, 402, 409, 411, 412, 414, 415; 174/68.5

[56] References Cited

U.S. PATENT DOCUMENTS

| | | | |
|---|---|---|---|
| 3,290,756 | 12/1966 | Dreyer | 29/155.5 |
| 3,679,941 | 7/1972 | LaCombe et al. | 317/101 A |
| 3,691,628 | 9/1972 | Kim et al. | 29/577 |
| 3,702,025 | 11/1972 | Archer | 29/574 |
| 4,300,153 | 11/1981 | Ilayakawa et al. | 357/80 |
| 4,347,306 | 8/1982 | Takeda et al. | 427/96 |
| 4,417,393 | 11/1983 | Becker | 174/68.5 |
| 4,426,773 | 1/1984 | Hargis | 29/382 |
| 4,588,468 | 5/1986 | McGinty et al. | 156/345 |
| 4,613,891 | 9/1986 | Ng et al. | 357/68 |
| 4,617,085 | 10/1986 | Cole et al. | 156/643 |
| 4,677,528 | 6/1967 | Miniet | 361/398 |

FOREIGN PATENT DOCUMENTS

| | | |
|---|---|---|
| 0010657 | 10/1979 | European Pat. Off. |
| 0175870 | 12/1981 | European Pat. Off. |
| 0111128 | 12/1983 | European Pat. Off. |
| 0178227 | 10/1985 | European Pat. Off. |
| 0228694 | 12/1986 | European Pat. Off. |

OTHER PUBLICATIONS

Jubb, Charles "PC Board Layout Via AutoCAD", Cadence, vol. 1, No. 2, pp. 51–55.
Angell, Richard "End-to-End Design", PC Tech Journal, vol. 4, No. 11, Nov. 1986, pp. 97–119.
Clark, R. J. and Nakagawa, T., "The STD Process-New Developments and Applications", Abstract from the 1974 Microelectronics Symposium held Oct. 1974, pp. 131–144.
High Technology, Oct. 1986, p. 55.
"Embedding ICs in Plastic Cuts Interconnect Space", Electronics, Jun. 9, 1986, pp. 17 and 20.
Hennpenheimer, T. A., "Monster Chips", Popular Science, pp. 104, 106, 108 and 110.
IBM Technical Disclosure Bulletin, vol. 28, No. 5, Oct. 1985, "Lift-Off Stencil Created by Laser Ablation", p. 2034.

(List continued on next page.)

Primary Examiner—Robert S. Macon
Assistant Examiner—A. Whitehead
Attorney, Agent, or Firm—Marvin Snyder; James C. Davis, Jr.

[57] ABSTRACT

The present invention employs a high density interconnect method to take advantage of a packaging arrangement in which full customization of an integrated circuit chip package is providable in a single metallization layer. The integrated circuit chips are positioned to take full advantage of a wiring layer which includes a plurality of periodically interrupted conductor patterns. All of the customization is provided in a single layer which may be readily fabricated and produced in a single day making it possible for extremely rapid turn around time in the design of complex integrated circuit systems, particularly those constructed from readily available integrated circuit components including microprocessors, random access memory chips, decoders and the like. An integrated circuit is also disclosed for fully taking advantage of the capabilities of testing made available by the high density interconnect system.

17 Claims, 5 Drawing Sheets

OTHER PUBLICATIONS

Egitto, F. D. et al., "Plasma Etching of Organic Materials. I. Polyimides in $O_2$–$CF_4$", *Journal of Vacuum Science & Technology/B3*, (1985), May–Jun., No. 3, pp. 893–904.

Auletta, L. V. et al., "Flexible Tape Conductor Interconnection for Chips", *IBM Technical Disclosure Bulletin*, vol. 24, No. 2, Jul. 1981, pp. 1214–1215.

Lukaszek, W. et al., "CMOS Test Chip Design for Process Problem Debugging and Yield Prediction Experiments", *Solid State Technology*, Mar. 1986, pp. 87–93.

Auletta, L. V. et al., "Flexible Tape Conductor Interconnection for Chips", *IBM Technical Disclosure Bulletin*, vol. 24, No. 2, Jul. 1981, pp. 1214–1215.

INTEGRATED CIRCUIT PACKAGING CONFIGURATION FOR RAPID CUSTOMIZED DESIGN AND UNIQUE TEST CAPABILITY

BACKGROUND OF THE INVENTION

The present invention is generally directed to a packaging configuration for integrated circuit chips which guarantees routability of interconnection lines and which may be rapidly configured in accordance with a given engineering design. More particularly, the present invention is related to a packaging method in which polymer film overlays are provided with metallization patterns as a means for configuring an integrated circuit chip or chips in an operating arrangement which is customized yet may be produced in a very short time, typically less than one day. The packaging configuration of the present invention also permits the utilization of a novel macrocell chip design which is particularly useful for the testing of chip functional blocks The generic problem to be solved herein is the fabrication of an electronic system from a given engineering design in an economical and expeditious fashion. A second, related problem is providing a method of testing which quickly isolates faults and provides a very high degree of assurance that the tests have been thorough and complete. The testing method should be done in an expeditious and economical fashion. Clearly, electronic systems have coped with these problems to a degree. Prior art systems include: interconnecting of packaged chips by wire wrap and printed circuit techniques, gate arrays, programmable logic arrays and fully customized integrated circuit fabrication.

Interconnecting packaged chips has been the main method to provide many electronic systems over the past 20 years. In the wire wrap method, sockets with wire wraps are provided and logic chips to be interconnected are placed in these sockets. Subsequently, interconnections are provided by wrapping wires around wire wrap pins according to a wire list. This can be done by automatic or manual machinery. The major drawback of wire wrap is the length of time required to wrap a single board which precludes this method from being economic for all but prototyping applications. In addition, wire wrap boards cannot be checked for accuracy of wiring both in interconnect and shorts except by using expensive, dedicated machinery. Also, wire wrap provides a relatively low performance interconnect since runs are long and since they suffer from high capacitance loading effects. Once chips have been installed on a wire wrap board, it is difficult to partition the board for simple tests and so testing to a high degree of functional assurance generally requires complex and time consuming testing apparatus. Finally, wire wrp prototyping boards are expensive because they contain a large number of holes and each wire wrap socket must supply long pins for wire wrapping.

Printed circuit boards are another method of interconnecting packaged chips. A printed circuit board typically comprises copper runs adhered to a glass fiber epoxy substrate. Packaged chips are mounted on the substrate and package pins are soldered to runs on the board. In terms of prototyping, the time from completion of the circuit definition until populated boards are received can be quite long. Layout for the printed circuit boards, if done by hand, can require two weeks to a month for a fairly complicated circuit board containing 100-200 chips. Even with computer aided layout, the amount of computer time required to route the board is substantial for a complicated board. In addition, complicated boards require multiple circuit layers which makes design and fabrication of printed circuit board a time consuming process. A typical short turn around time can be on the order of two weeks. In addition, special tooling must be provided in order to test that all the connections are made on the board and that no undesired short circuits exist. At this point it is still necessary to populate the board with chips and to solder them in place. Chip population is generally done in different plant locations than board fabrication because a large number of chips must be kept in inventory and are specific to the needs of a particular operating department, while board fabrication is more generic in nature. The problem of testing the finished assembly is the same as with a wire wrap method in that a fully interconnected assembly generally requires a large array of complex test vectors in order to derive a high degree of assurance that the system will work under all desired conditions.

A gate array is also a solution to the problem of providing an electronic chip system. A gate array is primarily a medium to high volume device. In the gate array, arrays of P-channel and N-channel transistors are fabricated in an array structure on integrated circuit wafers. These circuits are completely fabricated with the exception of the last metallization step. Logic designs are achieved by custom connecting the P-channel and N-channel transistors with the last metallization layer. This method makes relatively efficient use of silicon and utilizes computer aided layout directly from circuit definitions. Time is required to fabricate masks for the last metallization step and to finish the processing of the wafers. Typical time for the steps of automatic layout mask generation and chip fabrication requires at least two weeks. At this point, thousands of chips can be relatively easily fabricated, but thousands of chips are generally not required for prototyping quantities and for many applications. To further complicate the problem, complete systems require custom testing by the vendor of the gate array before the chips can be packaged with the test vectors and condition developed and supplied by the circuit engineer. This means that the circuit engineer must do sufficient simulation to develop a set of qualification test vectors. Further testing must be accomplished after prototype chips arrive at the circuit engineer's site. While simulation can greatly decrease the risk of design errors in the chips, it does not cover the operation of a chip in an electronic system substantially similar to its operating environment. Generally, faults will be found and updates will be necessary and the requirement for additional prototypes with more changes will be created. This process is both costly and stretches the time to completion of a project substantially because each iteration requires at least two weeks. In addition, a single gate array cannot provide all the structures necessary for a complete electronic system. For example, voltages and current may not be compatible at the interface level and may require addition of bipolar devices for analog digital conversion at the input and digital to analog conversion at the output. Also, many systems require some form of memory. This means that the gate array would necessarily require an additional printed circuit board to interconnect the memory or interface devices.

A programmable logic array can be used to provide an electronic system economically in low volume for some applications. The major disadvantage of logic arrays is that they make inefficient use of silicon because the logic array must provide for all possible Boolean functions in "AND/OR" configurations. In those few applications where this type of Boolean logic is required the logic array can be programmed for the desired Boolean functions. Most systems, however, require a large number of logic arrays to achieve the desired function and this is not economical except possibly for the very first prototype.

Full custom integrated circuits can generally provide about two to three times the functionality available in the same area from a gate array, but the processing cost and non-recurring cost is substantially increased. Layout must now involve all layers of the chip and processing must also involve all layers of the chip. Three month turn-around times are typical for the processing associated with a fully custom integrated circuit chip. Test vectors and probe cards are also special. This means that substantial volume must be involved before the fully custom chip is economical. As a rule of thumb, volumes over 10,000 units per year are generally required.

The invention described herein also solves a slightly different problem with the same method and structure. In present day electronic systems, the primary components ar usually readily available. These primary components include random access memory and microprocessor chip family sets as well as analog-to-digital and digital-to-analog conversion. In present day systems, these primary components are interconnected using TTL logic. As used herein, the term "TTL logic" or "TTL functions" refer to a set of functional blocks generally referred to as the 7400 series and described in the text "The TTL Data Book for Design Engineers" by Texas Instruments, Inc. This function of interconnecting, buffering and tying together the primary components of the system is generally referred to as a "glue logic function". For example, in present-day integrated circuit boards, one often finds certain standard functional chips surrounded by a plurality of custom interconnected integrated circuit chips in so-called Dip packages. It is these numerous small surrounding chips that provide a "glue function". In future systems, the glue logic function may be provided by gate arrays and custom chips where a single chip replaces a large number of TTL chips. This leads to several problems. The first is that the number of pins in the custom glue chip can be quite high. In addition, all of the primary components are immediately available. In the past, TTL was also immediately available and system interconnection could commence immediately on receipt of a given design. However, a time discontinuity now exists in which the primary components are available, but the custom glue logic takes many weeks to fabricate. A problem solved by this invention is defining a generic glue logic chip which can be used in place of a large number of conventional TTL logic chips.

SUMMARY OF THE INVENTION

In accordance with a preferred embodiment of the present invention, an integrated circuit package comprises a substrate together with a plurality of integrated circuit chips disposed on the substrate so as to define a channel between the chips. The chips possess interconnect pads for intra- and intercircuit connections. An overlay layer is disposed over the chips and the substrate and is provided with a metallization pattern which includes a plurality of interrupted conductors extending along the channel. The overlay layer also includes apertures therein which are in alignment with at least some of the interconnect pads. The aforementioned package may then subsequently be provided with a second overlay layer to achieve a customizing function. The second overlying layer also has apertures aligned with at least some of the interconnect pads and also includes a second metallization pattern which connects, through the apertures, select interconnect pads. The second metallization pattern also includes at least some apertures therein positioned over the interrupted metallization pattern and includes metallization patterns thereon for connecting to and for bridging select ones of said interrupted conductors. In this fashion, a customized integrated circuit chip, particularly one performing a glue logic function, is readily fabricated, typically in less than a day. The circuit and metallization pattern arrangements also ensure that routing for the second metallization pattern is readily providable without complicated or time consuming routing algorithms.

In accordance with another embodiment of the present invention, a multifunction digital circuit includes a plurality of functional digital circuit blocks having input and output lines. Decoding means for selecting one of the functional blocks is also provided. Shift register means are also provided for storing test data and for storing output data from the output lines of the digital circuit blocks in response to test data presented. Such a multifunctional digital circuit may be repeated many times on a given integrated circuit die. Such a circuit is not only flexible, but is also readily testable both before and after customization.

In the present invention, the fabrication of customized integrated circuit chips is achieved with very fast turn around time by combining high density interconnect methods described in related patent documents (referred to below) with a novel integrated circuit. The integrated circuit is configured with a large number of small pads which are interconnected by the high density interconnect method. The chip is divided into a multiplicity of blocks which contains standard TTL functions such as latches, counters, gates, adders, etc. On-chip switches provide the ability to select a given logic function. A novel shift register circuit provides connections to all inputs and to all outputs of the chips for the purpose of testing. Testing can be accomplished both at the wafer level and uniquely at the system level where simple selection of switches can test any logic and any interconnects for opens and shorts. Blocks of logic elements and selection switches are iterated many times on a single chip. Using this configuration, a single chip which is 128 mils on a side, can replace the function of 50 logic chips and, additionally, provide capability for testing each separate logic block together with the capability for testing all system wiring for proper connection and freedom from short circuits.

Accordingly, it is an object of the present invention to provide a method for fabricating an electronic system in less than one day from the time the circuit design is available.

Another object of the present invention is to provide an electronic system that is testable at all stages of fabrication using simple test vectors and simple procedures; these stages include testing at the wafer level, and testing with a high degree of assurance at the finished assembly level.

A further object of the present invention is to provide an electronic system which eliminates the need for a printed circuit board.

A still further object of the present invention is to provide a general purpose low power logic replacement for a multiplicity of TTL logic chips.

Yet another object of the present invention is to provide an electronic system which can accommodate primary system components such as random access memory, ready only memory, microprocessors, and analog conversion devices, by interconnecting them with a glue logic function provided by a minimum number of fully tested chips with a large number of interconnect pads.

Yet a further object of the present invention is to provide a single chip which has the functionality of a large number of TTL chips such that a multiplicity of chip types need not be inventoried.

Yet another object of the present invention is to provide a structure in which very small chip pads are practical so that the chip can be interconnected by the small pads and the chip can be completely tested by conventional probing techniques at the wafer level.

Another object of the present invention is to provide a structure which allows a simple high speed algorithm to automatically define interconnects according to the circuit design provided, and, additionally to provide a structure in which the simple routing algorithm guarantees that 100% of the interconnections can be made.

Lastly, but not limited hereto, it is an object of the present invention to provide an electronic system structure which can take optimal advantage of the increased connection density afforded by direct interconnection according to the high density interconnection methods disclosed in related patent documents.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

It is easier to understand the present invention if it is first made clear how this invention is related to the high density interconnect system, as described in concurrently filed application Ser. No. 912,458 filed Sept. 26, 1986, application Ser. No. 912,455 filed Sept. 26, 1986, now U.S. Pat. No. 4,714,516 issued Dec. 22, 1987, application Ser. No. 912,456 filed Sept. 26, 1986, and application Ser. No. 912,454 filed Sept. 26, 1986. These applications are hereby incorporated herein by reference. In the high density interconnect system as described in the aforementioned patent applications assigned to the same assignee as the present application, semiconductor circuit chips are mounted on a substrate, and subsequently covered with an overlay layer. Interconnections are made from chip to chip, within chips and from chips to package pins by providing via holes through the overlay layer to chip pads and by patterning metallization above the via holes to provide the desired interconnections. The high density interconnect method allows a higher density of interconnections to be made between chips than has been heretofore available. Typical numbers are between one-half and one mil per line and between one-half and one mil for the diameter of via holes. In addition, methods have been disclosed whereby the conductor patterning and via holes are directly defined by a laser under the control of a computer. As such, it is possible to custom define each electronic structure with virtually no additional effort above making the same structure on a repeated basis. This ability to custom define electronic structures leads to new opportunities in phototyping and in the production of both low volume and high volume electronic systems. In the present invention, virtually all customization occurs in a single overlay metallization layer. This leads to very desirable situations in the area of special purpose custom chips. Firstly, the nigh density interconnect method takes full advantage of special purpose custom chips which provide conventional logic functions, thus making it possible to produce interconnected electronic systems of high performance which are fabricated economically in prototype form and also to produce relatively low volume quantities of these systems. Alternatively, the utilization of a high interconnect density generic logic chip takes significant advantage of the high density interconnect method by providing the so-called "glue logic" function in which primary components such as memory and microprocessors are logically interconnected.

Figure 1:
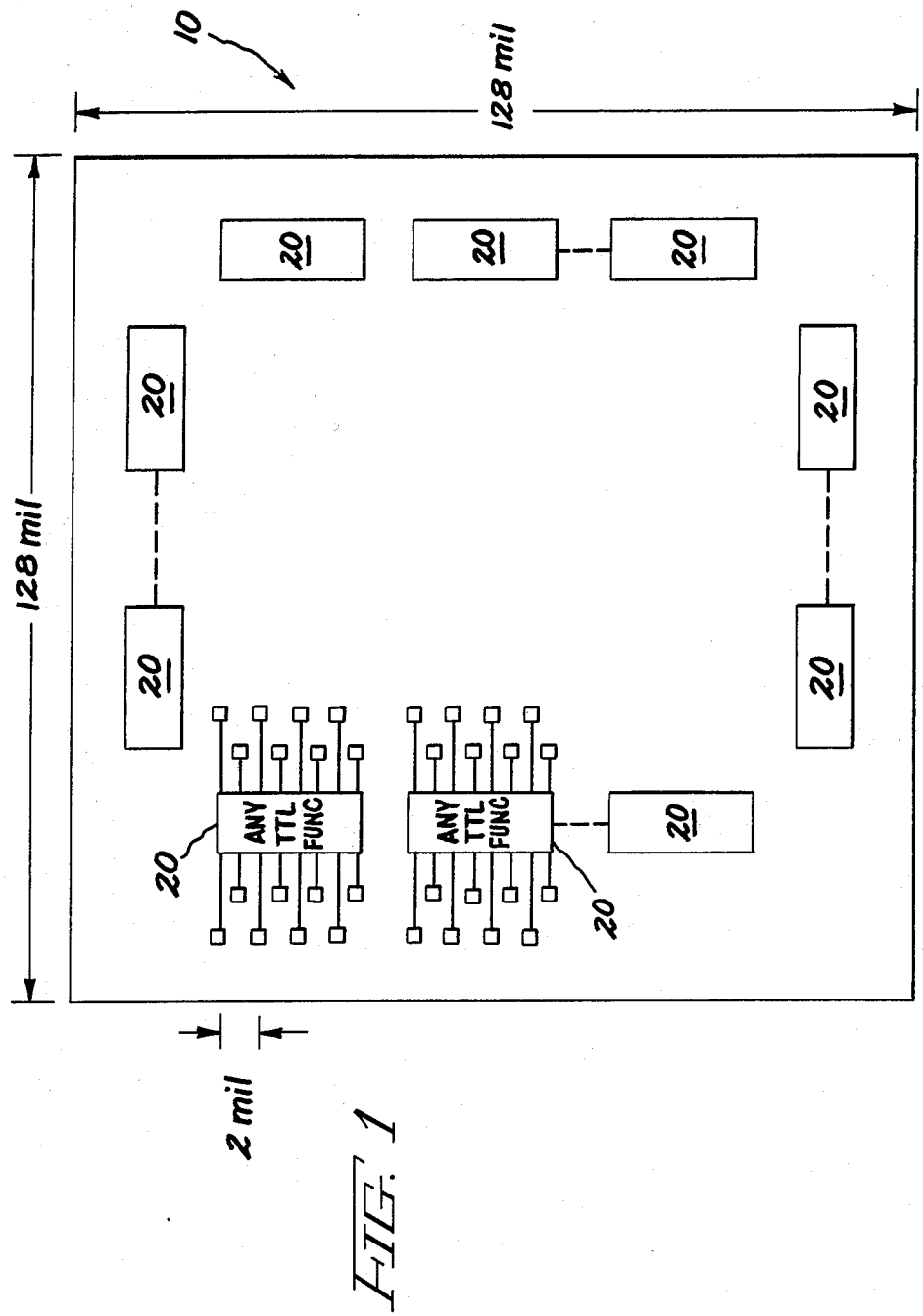
FIG. 1 is a schematic plan view illustrating the placement of functionally flexible and testable circuits on a single die.

FIG. 1 shows a functional equivalent of a block diagram of a customizable integrated circuit chip 10 in accordance with the present invention. It is seen from the figure that basic block 20 is repeated a number of times and includes number of input pads and output pads connected to a functional block which can provide virtually any TTL function. It is noted that chip 10 in FIG. 1 is merely a functional diagram. While the chip pads are preferably arranged on the chip in a regular order, it is not necessary that they be configured as shown in FIG. 1. In particular, FIG. 1 should not be read as suggesting that the central area is devoid of circuitry or chip pads. FIG. 1 is merely illustrative of the fact that chip 10 may be provided with a plurality of duplicate functional blocks 20. Blocks 20 are essentially independent entities, except perhaps for power connections. A preferable circuit for functional block 20 (in the context of providing a glue logic function) is discussed below with specific reference to FIG. 4.

To estimate the number of equivalent TTL packages which could be accommodated on single chip, a 2 mil spacing between pads is assumed. As indicated, solely for the purpose of example, it is also assumed that chip 10 is 128 mils on each side. Accordingly, 64 equivalent TTL packages could be derived from this single chip. This further assumes the utilization of approximately 8 out of 16 of the pads associated with each functional block 20. This results in a total of approximately 512 pads per chip. As used herein and in the appended claims, the term "pad" refers to a conductive area on an integrated circuit chip specifically designed and positioned for interconnection to other circuit elements. It is also noted that in conventional integrated circuit chip design, the pads are typically positioned around the periphery of a chip. However, the high density interconnection method is particularly amenable to the placement of interconnect pads anywhere on the chip.

Figure 2:
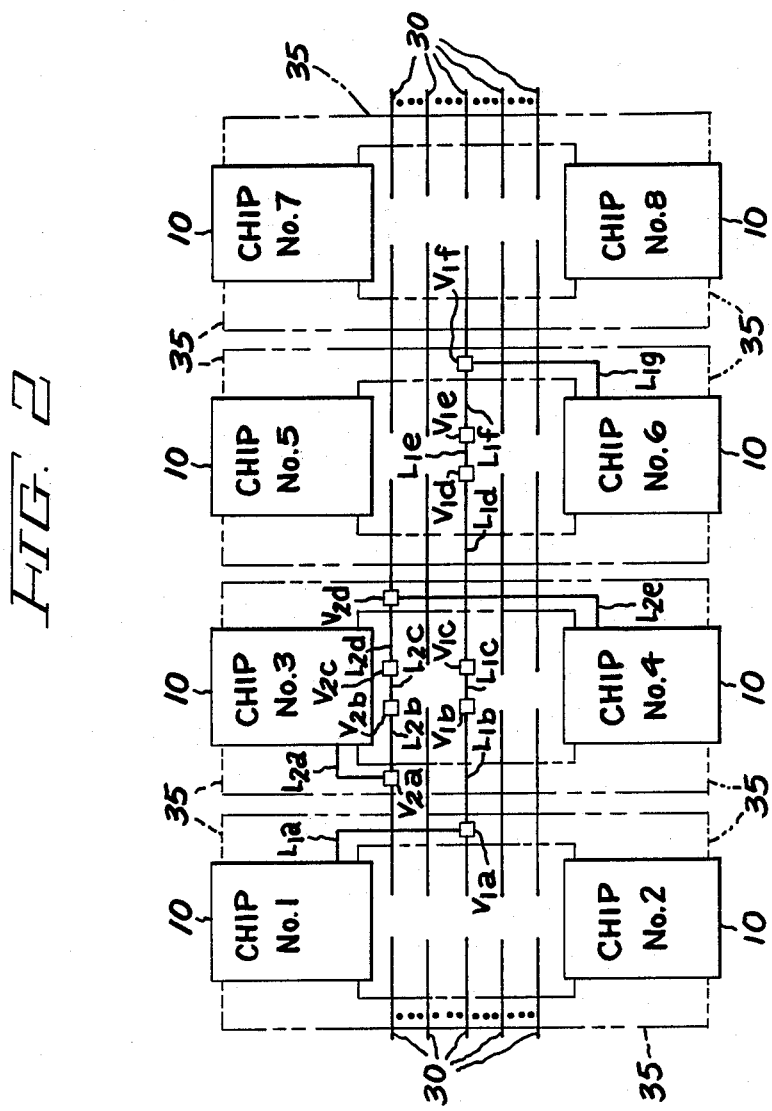
FIG. 2 is a schematic plan view illustrating a packaging and routing package configuration in accordance with the present invention.

FIG. 2 shows a layout of 8 of the chips from FIG. 1 on a substrate approximately 2 inches on a side. In particular, it is seen that chips 10 are preferably configured so as to define a horizontal channel in which periodically interrupted conductors 30 are disposed. Similarly, vertical wiring is typically disposed within regions 35 defined by phantom lines as shown. It is also to be particularly noted with respect to FIG. 2 that it represents a multilayer circuit in accordance with the high density interconnect method described in the aforementioned copending applications.

FIG. 2 is also important in that it shows that 100% connection routing is achievable. This is important because it guarantees that a computer can always complete routing once the circuit definition is provided. In this specific example, a substantial portion of the system is fabricated before the actual circuit is known. In this example embodiment, all custom interconnection is done with one metallization layer. Main channel wiring 30 comprises conductors disposed on 1 mil (for example) centers oriented horizontally as shown. These conductors are interrupted as shown in the diagram between each pair of chips mounted on the substrate. This is a preferred embodiment. However, it is noted that the main channel wiring does not have to be straight nor do chips have to be disposed in pairs. Main channel wiring 30 is, however, preferably disposed on the same substrate as chips 10.

After chips are mounted, an overlay layer (not shown specifically in FIG. 2) is applied. Via holes are fabricated over select pads on chips 10 and over the desired interconnect lines in the main channel section of the substrate. Details of these processes are contained in the aforementioned related patent applications. Via holes also fabricated on the ends of the main channel interconnect conductors 30 where it is necessary to continue a given conductor to the next pair of chips. Metallization is now applied and patterned. The interconnect lines can be brought out in an orderly fashion as shown in FIG. 2. Although only a few lines are shown for clarity, it can be seen that connections can be made to all pads of a given functional equivalent block on each chip. Further, each functional equivalent block can be connected to any other functional equivalent block on the same chip or on any other chip in the system.

Two completed interconnections are shown in FIG. 2 with the specific conductor runs shown more darkly. For example, it is seen in FIG. 2 that a connection is made from a chip pad on chip No. 1 through a via opening is the overlay layer (not shown) to vertically disposed conductor $L_{1a}$ which extends over the overlay layer (not visible) to via opening $V_{1a}$ and down therethrough to main conductor segment $L_{1b}$ (part of channel wiring 30) which extends horizontally at the substrate level to via opening $V_{1b}$ wherein metallization pattern $L_{1c}$ connects thereto through via opening $V_{1b}$. Conductive pattern $L_{1c}$ is disposed on the overlay layer and extends between via openings $V_{1b}$ and $V_{1c}$ so as to link main wiring segments $L_{1b}$ and $L_{1d}$. Line $L_{1d}$ extends to via opening $V_{1d}$ in the overlay layer and thereby connects to link $L_{1e}$ disposed on top of the overlay layer and connecting segment $L_{1d}$ with $L_{1f}$ by means of customizing link $L_{1e}$. Segment $L_{1f}$ extends from via opening $V_{1e}$ to via opening $V_{1f}$ at which point it connects to vertically oriented metallization line pattern $L_{1g}$ disposed on the upper overlay layer and connects to a select pad on chip 6. Thus, a customized link is established between chip No. 1 and chip No. 6 solely by the customized metallization pattern appearing on the overlay layer. Thus, the overlay layer metallization typically includes vertical links such as $L_{1a}$, $L_{1g}$ (and for linking chips 3 and 4, vertical segments $L_{2a}$ and $L_{2d}$). The overlay layer also includes horizontal links such as $L_{1c}$ and $L_{1e}$ which serve to bridge select interruptions in main channel wiring segments 30. Also for illustration, a second customizing link is also shown between chips 3 and 4. This link includes vertical segments $L_{2a}$ and $L_{2d}$ together with horizontal bridge $L_{2c}$ disposed on the customizing metallization layer. Similarly, this second example link also includes horizontal main wire segments $L_{2b}$ and $L_{2e}$. While it might first appear that link $L_{2d}$ and link $L_{1d}$ intersect so as to cause an undesired connection, it is noted that these two conductors are actually disposed on different layers which are insulated from one another. In particular, $L_{1d}$ is preferably disposed on the substrate layer while vertical link $L_{2e}$ is disposed on the customizing or overlay layer.

In the exemplary embodiment shown, there are approximately 500 pads on each chip and there are 8 chips shown. Since for each connection there must be a source and destination, the total number of interconnections will be one-half of 8×500 or approximately 2,000 interconnections. In order to avoid any possible contention, the main channel need only be 2 inches wide. This width assumes a 1 mil conductor pitch for purposes of example. It is also seen that the distance between adjacent chips need only be 0.5 inches, also assuming a 1 mil conductor pitch since each chip has a total of 512 total chip pads, so that one-half of those would come out on each side. This space is more than ample since approximately 128 conductors for each chip arise from the bottom of the chip. The extra space available may be used to route the wiring which connects to the pins of the package.

Figure 3:
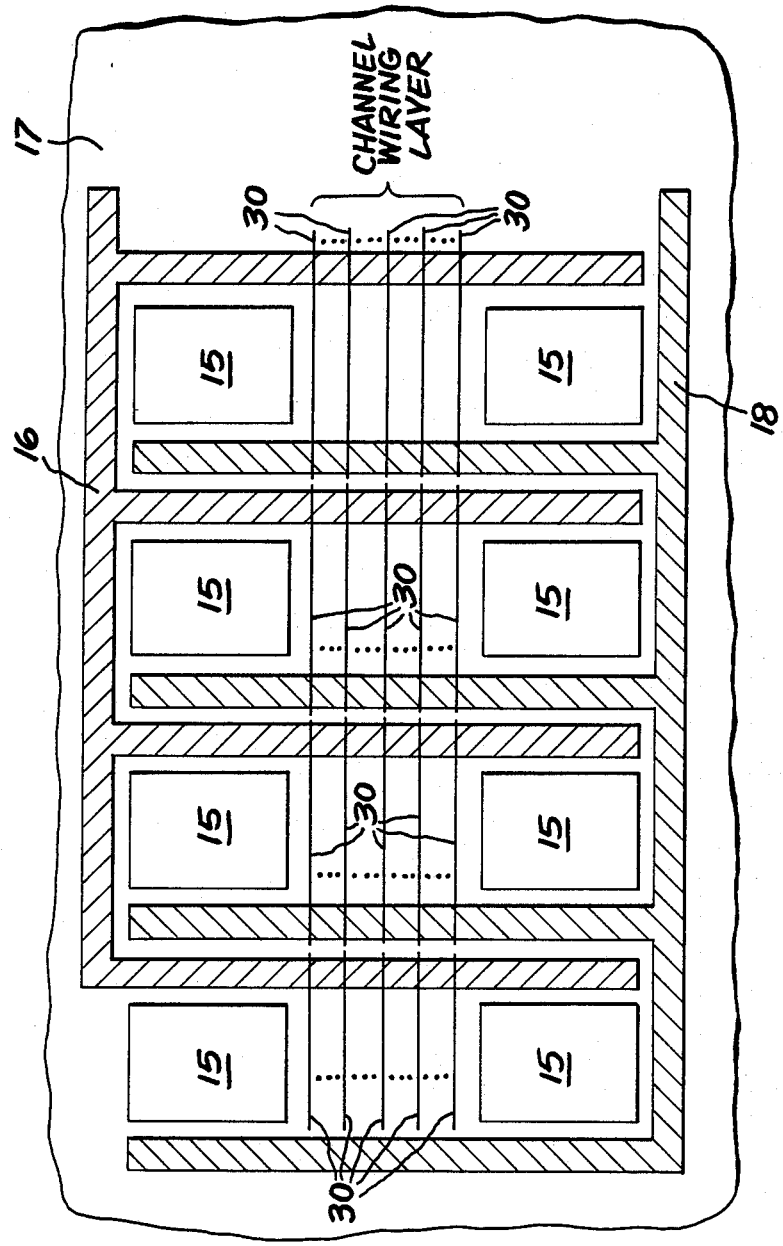
FIG. 3 is a view similar to FIG. 2 but more particularly illustrating the placement of power buses on a lower level.

Much of the package shown in FIG. 2 can be prefabricated as shown in part in FIG. 3. FIG. 3 shows the assembled package with main channel wiring 30, power supply wiring busses 16 and 18 and chip package wells 15. An insulating spacer is made of ceramic punched in the green state or laser cut to provide wells 15 for the chips. The top surface of ceramic 17 is metallized by direct-bond copper methods or other conventional means for metal deposition on ceramic. Power supply busses 16 and 18, as shown, are provided either by etching or are built up by semi-additive printed circuit methods which are well known in the art. Subsequently, a layer of polymer, for example DuPont Pyralin TM polymer is sprayed and cured on the ceramic. Vacuum deposition methods may be used to apply metallization and ordinary photolithographic methods are employed to pattern the metallization to form main channel conductors 30. Then, the package is ready for the addition of chips 10 into wells 15. At this point, a polymer film overlay may be provided as described in the aforementioned incorporated applications. The resulting structure is now ready for metalization and customizing as described above.

Thus far, a structure and method have been described which can interconnect any logical function block on any of 8 integrated circuit chips. More or less chips may be accommodated by varying the size of the main channel and the vertical channels. In this description, only a single layer of metallization is required to customize the interconnections and, additionally, the wiring is highly structured and defined with the exception of the definition of which pads in the given logic block or chip will be connected and which conductor in the main channel is used to complete the connection from a given source to a given destination. This, however, is a very straightforward routing problem which is readily solved with an absolute minimum of computer time. In fact, with the appropriate dimensions and number of main wiring segments, it is merely a matter of assigning the segments to a given connection path.

Figure 4:
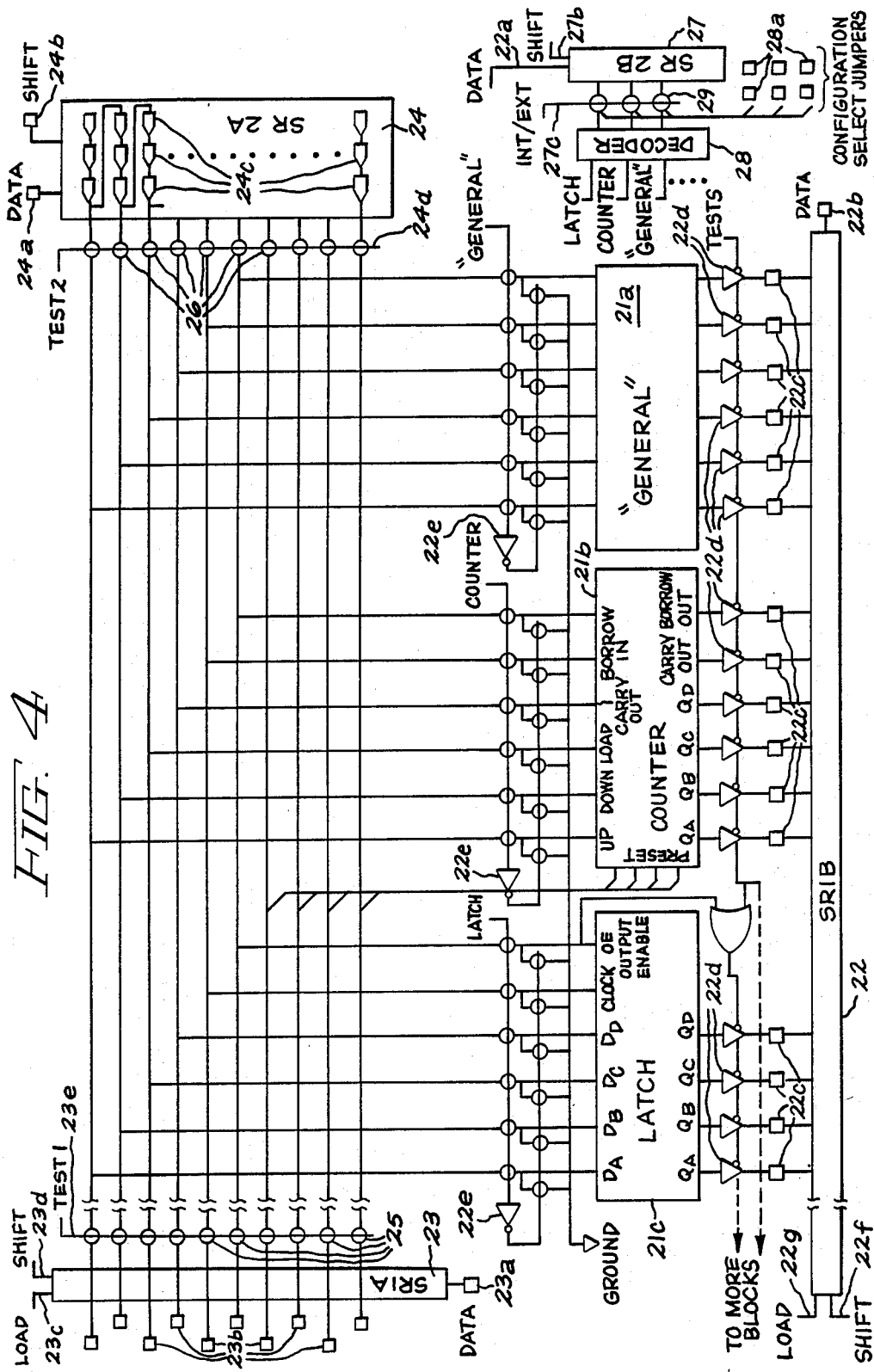
FIG. 4 is a schematic diagram illustrating a general block diagram of a repeatable logic structure for the functional blocks shown in FIG. 1.

According to the present invention, a structure has been shown in which integrated circuit chips of very high pad density are interconnected. The discussion below now focuses on a method and structure for building an integrated circuit which can be interconnected by the method disclosed above and which provides the functional equivalent of virtually any TTL logic function. In addition, each such logic block on a chip can be individually tested, both at the wafer stage and after interconnection in an electronic system. Further, the integrated circuit presented allows complete testing of all interconnections for short and open circuits. FIG. 4 shows a block diagram illustrating a single functional block 20. It should be noted that this functional block can be repeated as many times as the size of the chip allows. With each repetition, a totally new logic function is available for interconnection in an electronic system. In the diagram of FIG. 4, all input pads are isolated from the rest of the circuit by transmission gates such as gates 25, 26 and 29. Each set of transmission gates is controlled by a single test line. For example line 23e for TEST1 or line 24d for TEST2. The test involved with these lines is more particularly described below.

In normal operation, transmission gates 25 connect input pads 23b to the appropriate internal circuitry. During test mode, the input pads are isolated and internal circuitry is used to exercise the appropriate function block. In this embodiment, shift register SR2A (reference number 24) is used to supply test signals and shift register SR1B is employed to receive output signals (shift register SR1B is designated by reference number 22) for use in testing and configuring each of the function blocks 21a, 21b, 21c, etc. For example, in the test mode, the output of shift register SR2A is connected so as to internally supply test vectors to the appropriate logic function. When the inputs are disabled, shift register SR1A is connected to receive signals on the same set of lines and transmit these signals to pads 23b which also function as a means for providing signal output. Shift register SR1B, designated by reference numeral 22, is connected to receive outputs from each of the individual function blocks and to transmit these signals to a test point (pad) 22b. A logic function is selected by turning on the appropriate group of selection gates. Each group of selection gates associated with each logic function is connected to a decoder 28. Decoder 28 is addressed either by connection to shift register SR2B (reference numeral 27) or by connection to jumpers which bridge configuration selection pads 28a. These jumpers are wired when the customizing interconnection wiring is patterned. Note that when a particular logic function is not selected, minimum sized NMOS devices are gated on through inverters 22e to hold all of the inputs of that device at ground and therefore, at minimum power consumption.

It is also noted that the 3 functional blocks illustrated in FIG. 4 represent only 3 of 8 possible blocks which may be selected through decoder 28. In particular, FIG. 4 shows the inclusion of latch block 21c, counter block 21b and a block denoted "general" designated by reference numeral 21a. Other blocks which may be employed include adders, subtracters, multiplexers, multipliers and the like. Typically, such blocks are selected from the so-called 7400 series of logic functions.

The circuit of FIG. 4 shows some sample logic functions interconnected according to the present invention. The actual logic functions in the labeled boxes are well known in the art and accordingly their implementations need not be provided herein. In FIG. 4, there is shown general box 21a which represents any desired logic function. Examples of other logic functions which fit the format of the general box also include flip flops and decoder configurations. It should be noted that logic functions such as latches, counters, adders, decoders, etc. are relatively simple functions on a per bit basis and therefore, in the example of a 128 mil square chip, as many as 16 different logic functions can be accommodated in one repeatable logic block. It is also noted that the listing given above incorporates more than 90% of the total logic functions available in the so-called 7400 logic series. It should also be noted that other logic functions not described can be incorporated into the format shown with different mixes of logic function and with different numbers of bits. The present invention relates also to a method and structure of selecting a particular logic function and of interconnecting these logic functions according to a custom interconnection pattern. Note that part of the custom interconnection includes selection of the configuration and application of 1 or 0 logic level to the appropriate preset and configuration nodes on the logic element.

The embodiment of the present invention shown in FIG. 4 presents a unique testing capability. Each shift register shown in the function block of FIG. 4 is repeated as the function blocks are repeated. As many shift registers as desired can be coupled in series such that only a data and a shift clock pad are necessary for shift registers where data is shifted into a shift register. DATA, SHIFT and LOAD pads are necessary where data is loaded in parallel into a shift register and then is shifted out. As a result, only 5 pads are necessary to control the data to any given shift register chain. As a practical matter, a typical configuration involves chaining together the test shift registers for all the blocks on one side of a chip resulting in four sets of shift registers. To test the circuit, data is loaded into shift registers SR2A and SR2B. Shift register SR2A selects the test pattern and shift register SR2B selects the block to be exercised. Shift register SR2A can consist of three stages for each test event. This allows the shift register to be clocked in rapid succession and to provide a dynamically changing sequence for the purpose of testing propagation delays and responses to clock edges. A LOAD pulse on shift register SR1B loads the output of the logic function from tristate latches 22d into shift register SR1B. At this point, shift register SR1B contains the resultant output response of the selected logic function corresponding to the transient test vector applied by shift register SR2A.

Figure 5:
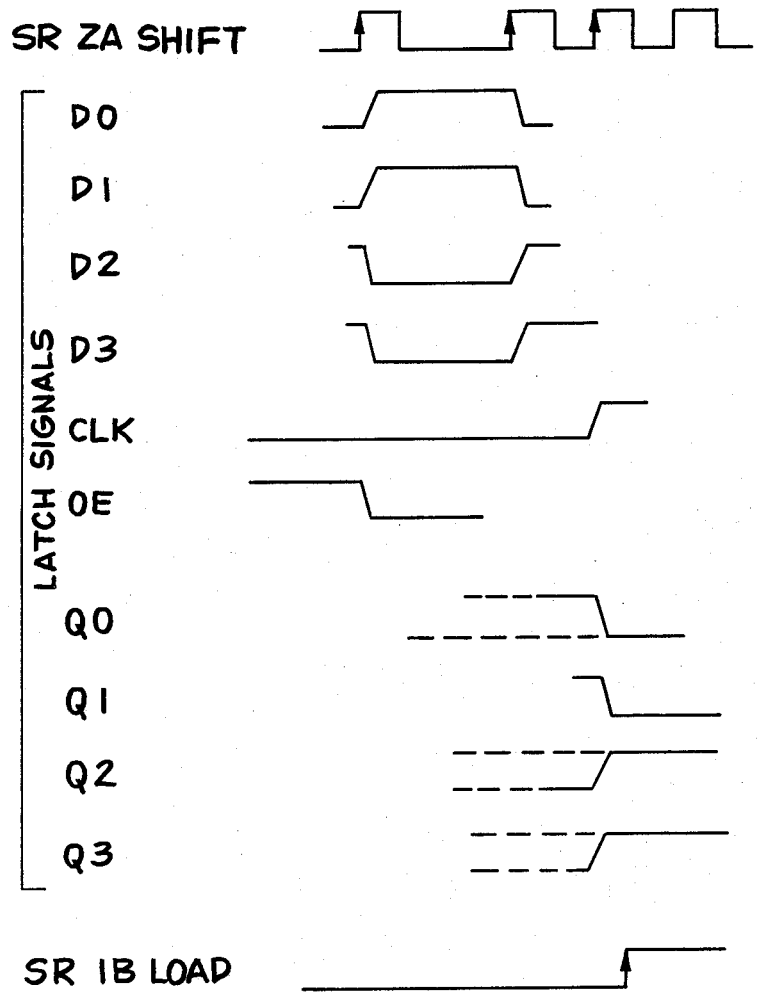
FIG. 5 illustrates a timing diagram for a sample test sequence.

FIG. 5 shows a timing relation for a test of the latch function in FIG. 4. Bits D0 and D1 are toggled from a 1 to a 0, while bits D2 and D3 are toggle from a 0 to 1. When this test is executed, shift register SR2A is clocked to set the D0 through D3 bits. After a settling time, the shift register is clocked rapidly two more times. First to set the data into the latch and second to control the latch. After the propagation delay time of the latch has passed, the data appears at the output of the latch and is loaded into shift register SR1B. Shift register SR1B can then be "read out" and its contents compared with the expected results. Clearly, if the same test vector is shifted into the equivalent shift register SR2A in each function block, all latches in all function blocks are tested simultaneously with a test that considers both logic function and propagation time. Probe testing is essentially accomplished in this manner with a very few number of probes connected to the appropriate shift and load pads for the number of shift registers chained together. In the example presented, this could comprise a group of four shift registers. Testing proceeds by testing all the necessary test vectors for each logic function in a logic block. It should be noted that not all logic functions on the chip need to work for the chip to be fully utilized. For example, if the preset counter fails the tests but the latch is working, then this function block can be used in any system where a latch is required. It should also be pointed out that not all function blocks need to be utilized. In some of the logic functions, more pads are required than are allowed by the pitch of the interconnect wiring. It is necessary then, when such a logic function is used, to skip the next function block or to use it in a mode where very few of the pads are used. A very simple strategy is to assume that one of every five function blocks will not be utilized. This allows space for extra wiring. It also allows selection of which of those function blocks is not utilized, to be made on the basis of which function block has failed in testing. It can be seen that the yield of usable chips is very high. This is due to the fact that the chip, as defined, is very small by present processing standards. In addition, because the chip is partitioned into repeating function blocks, chips containing bad function blocks can be utilized with virtually no penalty.

When chips are interconnected to an electronic system, the testing procedure is essentially the same. In this case, the configuration is defined by the interconnect wiring. Interconnects are provided to hardwire the inputs to the decoder. In addition, interconnects are provided which can tie together the input and output of the test shift registers and tie as many pads as necessary to external pins in the package. In this way, signals applied externally can be used to check for opens and shorts in all interconnects in the system. The procedure for checking for proper operation of a given logic function is the same as before. The test mode is selected by isolating the input pads with the transmission gate associated with them. Shift registers SR2A and SR2B are loaded and clocked as previously described with the resultant function output being loaded into shift register SR1B. The contents of shift register SR2B are superfluous since the decoder is hardwired to select only one of the logic functions. After test vectors have been applied to ensure that all logic functions on all chips are operating satisfactorily, a wire check proceeds as follows: outputs are defined as sources and inputs as destinations. The strategy is to set one single source in the entire system to logic 1 while all other sources are set to logic 0. Then test all destinations to determine that the logic 1 appears only at the desired destination and at no other point. This checks both for connectivity and for unwanted short circuits. The process is then repeated for the same source by setting the source to 0 and setting all other sources in the system to logic 1. Simple test vectors can be used and applied to each logic element in the system to provide the single 1, all 0 and single 0 all 1 outputs desired. When the appropriate outputs are supplied, shift register SR1A is strobed, and thus captures the logic states at all destinations in the system. This logic state is then clocked out and inspected to ensure that only the desired destinations are reached. After all sources have been checked in the same way, the process is reversed. The drivers for all logic units are placed in their tristate output disabled condition. The transmission gates which isolate the inputs from the given logic function is closed and shift register SR2A now acts as a source of data to the pads normally associated with inputs. Again, a single 1 is placed on a given destination pad with zeros on all other pads. Shift register SR1B is strobed so as to capture the logic state at all source pads. This secondary check looking backward through the system by supplying data at destination pads and observing it at the source pads, provides a complete check of all wiring in the system. It is important to note that the procedure outlined above is independent of the complexity of the circuitry which is formed by interconnecting the various logic function blocks. That is, the vectors required for a single 1 and all 0 from a particular logic function are always the same for that logic function and can be stored in a table. The wiring list which defines sources and destinations, is the schematic which was entered originally. It is then possible to guarantee that each functional logic block operates as desired and that all interconnections in the system including those on the chip, are properly made without short circuits. This then provides a very high degree of assurance that the circuits function properly when the original logic is correct. Put another way, assuming the basic logic circuit is free from human logic error, any circuit tested for interconnect and logic block functionality performs the complex functions desired with a high degree of assurance.

Thus far, the structure described is a multiplicity of identical or nearly identical logic chips interconnected to form a complex electronic system. The chip described above can also be used in electronic systems which utilize primary electronic devices such as random access memory, microprocessor, analog to digital conversion and the like. The specific structure described uses only one layer of metallization for interconnection because one layer can be applied and patterned in less time than additional layers. Additional layers can be used to increase packing density of the system and interconnect one or more of the chips described to use them as the glue logic in complex electronic systems.

From the above, it should be appreciated that the packaging system and multifunctional integrated circuit block of the present invention satisfies all of the objectives stated above. It is further seen that the system of the present invention provides a very significant advance in the art of integrated circuit packaging and customization. It is further seen that the system of the present invention makes it possible to rapidly fabricate complex electronic systems in very short periods of time. It is also seen that the system of the present invention makes is possible to construct and test complex integrated circuit systems and electronic components in a reliable and highly efficient manner.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. An integrated circuit package comprising:
   a substrate;
   a plurality of integrated circuit chips disposed on said substrate so as to define a channel between said chips, said chips having interconnect pads thereon; and
   a metallization pattern disposed on said substrate, said pattern including a plurality of periodically interrupted conductors extending along said channel.

2. The package of claim 1 further including an insulative overlay layer disposed over said chips and said substrate, said overlay layer including apertures therein in alignment with at least some of said interconnect pads.

3. The package of claim 2 further including a second insulative overlay layer having apertures therein aligned with at least some of said interconnect pads and also including a second metallization pattern connecting, through said apertures, select interconnect pads, said second metallization pattern also including at least some apertures therein positioned over said interrupted metallization patterns and including metallization patterns thereon for connecting to and for electrically bridging select ones of said interrupted conductors.

4. The package of claim 1 in which said integrated circuit chips are disposed in pairs, each chip of a pair being disposed on an opposite side of said channel.

5. The package of claim 4 in which said interruptions in said metallization pattern are positioned between said chip pairs.

6. The package of claim 1 in which said substrate comprises material selected from the group consisting of ceramics, metal, plastics, composites, silicon and glass.

7. The package of claim 1 in which said overlay layer comprises a polymer film.

8. The package of claim 1 in which a separate layer is employed to supply power to said chips.

9. The package of claim 1 in which said substrate includes wells for placement of said chips.

10. An integrated circuit package comprising:
    a substrate;
    a plurality of integrated circuit chips disposed on said substrate so as to define a channel between said chips, said chips having interconnect pads thereon; and
    an insulative overlay layer disposed over said chips and said substrate, said overlay layer having a metallization pattern thereon, said pattern including a plurality of periodically interrupted conductors extending along said channel, said overlay layer also including apertures therein in alignment with at least some of said interconnect pads.

11. The package of claim 10 which further includes a second overlay layer having apertures therein aligned with at least some of said interconnect pads and also including a second metallization pattern connecting, through apertures in said second layer, select interconnect pads, said second metallization pattern also including at least some apertures therein positioned over said interrupted metallization pattern and including metallization patterns thereon for connecting to and for electrically bridging select ones of said interrupted conductors.

12. A multifunction circuit comprising:
    a plurality of functional circuit blocks having input and output lines;
    decoding means for selecting one of said functional blocks;
    means for storing test data to be supplied to said input lines, said input line being selectable in response to said decoding means;
    means for storing data from said output lines of said circuit blocks; and
    means for receiving test data from said means for storing test data.

13. The multifunction circuit of claim 12 in which at least one of said storing means and said receiving means comprises a shift register.

14. An integrated circuit package comprising:
    a substrate;
    a plurality of integrated circuit chips disposed on said substrate, said chips having interconnect pads thereon; and
    at least one polymer layer disposed over said chips and said substrate, said polymer layer including apertures therein in alignment with at least some of said interconnect pads;
    wherein at least one of said chips includes a plurality of functional circuit blocks having input and output means and decoding means for selecting one function from within at least one of said blocks.

15. The circuit of claim 14 in which at least said function blocks include:
    means for storing test data to be supplied to said input means;
    means for storing data from said output means; and
    means for receiving test data from said test data storing means.

16. The circuit of claim 14 further including a metallization pattern disposed on said polymer layer so as to interconnect select interconnect pads on said chips.

17. An integrated circuit package comprising:
    a substrate;
    a plurality of integrated circuit chips disposed on said substrate so as to define a channel between said chips, said chips having interconnect pads thereon;
    at least one polymer layer disposed over said chips and said substrate, said polymer layer including apertures therein in alignment with at least some of said interconnect pads;
    wherein at least one of said chips includes a plurality of functional circuit blocks having input and output means and decoding means for selecting one function from within at least one of said blocks; and
    a metallization pattern disposed on said substrate, said pattern including a plurality of periodically interrupted conductors extending along said channel.

* * * * *